US012751296B2

(12) United States Patent
Eom et al.

(10) Patent No.: US 12,751,296 B2
(45) Date of Patent: Sep. 29, 2026

(54) SEMICONDUCTOR DEVICE

(71) Applicant: POWER MASTER SEMICONDUCTOR CO., LTD., Cheongju-si (KR)

(72) Inventors: Jooyaung Eom, Gimpo-si (KR); Ki-Myung Yoon, Bucheon-si (KR); Taekkeun Lee, Seoul (KR); Soonho Kwon, Bucheon-si (KR)

(73) Assignee: POWER MASTER SEMICONDUCTOR CO., LTD., Cheongju-si (KR)

( * ) Notice: Subject to any disclaimer, the term of this patent is extended or adjusted under 35 U.S.C. 154(b) by 549 days.

(21) Appl. No.: 18/218,182

(22) Filed: Jul. 5, 2023

(65) Prior Publication Data

US 2024/0014106 A1 Jan. 11, 2024

(30) Foreign Application Priority Data

Jul. 6, 2022 (KR) ........................ 10-2022-0083365
Jun. 30, 2023 (KR) ........................ 10-2023-0085196

(51) Int. Cl.
*H10W 70/40* (2026.01)
*H10W 40/25* (2026.01)
*H10W 90/00* (2026.01)

(52) U.S. Cl.
CPC ....... *H10W 70/427* (2026.01); *H10W 40/258* (2026.01); *H10W 70/442* (2026.01);
(Continued)

(58) Field of Classification Search
CPC ....................... H01L 23/49551; H10W 70/427
See application file for complete search history.

(56) References Cited

U.S. PATENT DOCUMENTS 4,801,765 A * 1/1989 Moyer ................ H10W 70/411 174/541
9,589,922 B2 3/2017 Neugirg et al.
(Continued)

FOREIGN PATENT DOCUMENTS

JP 2012-019089 1/2012
KR 10-2006-0017711 2/2006
(Continued)

*Primary Examiner* — Brent A. Fairbanks
*Assistant Examiner* — Krishna J Palaniswamy
(74) *Attorney, Agent, or Firm* — LEX IP MEISTER, PLLC

(57) ABSTRACT

Provided is a semiconductor device. A semiconductor device may include: a substrate formed to extend along a first direction; a first semiconductor chip formed on the substrate; a second semiconductor chip formed on the substrate at a predetermined distance from the first semiconductor chip along the first direction; a first lead frame extending outwardly beyond the substrate along the first direction, the first lead frame having a lower surface connected to upper surfaces of each of the first semiconductor chip and the second semiconductor chip; and a heat sink formed at a position corresponding to the first semiconductor chip and the second semiconductor chip on the first lead frame, wherein the first lead frame includes a first groove region formed between a region on the lower surface connected to the upper surface of the first semiconductor chip and a region on the lower surface connected to the upper surface of the second semiconductor chip.

9 Claims, 14 Drawing Sheets

(52) U.S. Cl.
CPC ......... *H10W 70/461* (2026.01); *H10W 90/00* (2026.01); *H10W 90/736* (2026.01)

(56) References Cited

U.S. PATENT DOCUMENTS

| | | | | |
|---|---|---|---|---|
| 9,831,160 | B2 | 11/2017 | Kadoguchi et al. | |
| 11,037,907 | B2 | 6/2021 | Im et al. | |
| 2015/0061098 | A1* | 3/2015 | Imoto | H10W 70/40 257/676 |
| 2019/0341332 | A1 | 11/2019 | Lin et al. | |
| 2020/0211933 | A1* | 7/2020 | Raposas | H10W 70/042 |

FOREIGN PATENT DOCUMENTS

| | | | | |
|---|---|---|---|---|
| KR | 10-2012-0082706 | | 7/2012 | |
| KR | 10-2015-0022957 | | 3/2015 | |
| KR | 20150022957 | A * | 3/2015 | H10W 74/00 |
| KR | 20-2015-0002420 | | 6/2015 | |
| KR | 10-2018-0090127 | | 8/2018 | |
| KR | 20180090127 | A * | 8/2018 | H01L 23/58 |
| WO | 2022/033547 | | 2/2022 | |

* cited by examiner

SEMICONDUCTOR DEVICE

CROSS-REFERENCE TO RELATED APPLICATION

This application claims priority to and the benefit of Korean Patent Application No. 10-2022-0083365 filed in the Korean Intellectual Property Office on Jul. 6, 2022, and Korean Patent Application No. 10-2023-0085196 filed in the Korean Intellectual Property Office on Jun. 30, 2023, the entire contents of which are incorporated herein by reference.

BACKGROUND a. Technical Field

The disclosure relates to a semiconductor device.

(b) Description of the Related Art

Power semiconductor devices are semiconductor devices that transmit, control, and convert power, and the importance of power semiconductor devices is increasing, especially for high-power applications such as eco-friendly vehicles, for example hybrid vehicles (HEVs), electric vehicles (EVs), plug-in hybrid electric vehicles (PHEVs), and hydrogen fuel cell vehicles (FCEVs). For example, an insulated gate bipolar transistor (IGBT) is a power electronic device combining high input impedance characteristics of a metal oxide semiconductor field effect transistor (MOSFET) and low conduction loss characteristics of a bipolar junction transistor (BJT), and it is suitable for applications where the switching speed is fast while keeping the voltage high. As another example, Silicon Carbide (SiC) is a high-performance semiconductor material with higher electrical conductivity than silicon, high thermal conductivity, possibility of device operation at high temperature, high voltage and current density, high switching speed, etc, and SiC semiconductors may be suitable for high power, high temperature, or high frequency applications.

Power semiconductor devices generate a significant amount of heat during operation, and when this heat builds up within the device, it can cause serious damage. Therefore, thermal management is a very important consideration in power semiconductor package design. In this regard, since the single-side cooling method dissipates heat only on one surface (generally, the lower side of the module), the heat dissipation capability is limited and may be insufficient in the case of power semiconductor devices with high power densities. In contrast, in the double-sided cooling method, since heat is dissipated on both sides of the module, more heat can be quickly dissipated than in the single-side cooling method, and thus the operating temperature of the module is lowered, thereby improving the performance and lifespan of the power semiconductor device.

SUMMARY

One problem to be solved is to provide a semiconductor device capable of increasing a heat dissipation effect, improving thermal resistance characteristics, and reducing electrical resistance.

Another problem to be solved is to provide a semiconductor device capable of simplifying a manufacturing process, increasing process productivity, improving yield, and reducing manufacturing cost.

A semiconductor device according to an example embodiment may include: a substrate formed to extend along a first direction; a first semiconductor chip formed on the substrate; a second semiconductor chip formed on the substrate at a predetermined distance from the first semiconductor chip along the first direction; a first lead frame extending outwardly beyond the substrate along the first direction, the first lead frame having a lower surface connected to upper surfaces of each of the first semiconductor chip and the second semiconductor chip; and a heat sink formed at a position corresponding to the first semiconductor chip and the second semiconductor chip on the first lead frame, wherein the first lead frame includes a first groove region formed between a region on the lower surface connected to the upper surface of the first semiconductor chip and a region on the lower surface connected to the upper surface of the second semiconductor chip.

In some embodiments, the first lead frame may further include a second groove region formed between a region on the lower surface connected to the upper surface of the second semiconductor chip and a region on the lower surface extending outwardly.

In some embodiments, a width of the second groove region may be smaller than a width of the first groove region.

In some embodiments, a groove depth of the first groove region and a groove depth of the second groove region may be formed within 80% of a thickness of the first lead frame.

In some embodiments, the first lead frame may further include a first bending region on the region on the lower surface extending outwardly, such that an extension of the first lead frame along the first direction continues at a point moved by a predetermined distance along a second direction perpendicular to the first direction.

In some embodiments, the first lead frame may be connected to a second lead frame in the region extending outwardly, and the semiconductor device may further include a first contact region including a portion of the first lead frame and a portion of the second lead frame contacting each other.

In some embodiments, the first lead frame may further include a second bending region on the region on the lower surface extending outwardly, such that an extension of the first lead frame along the first direction continues at a point moved by a predetermined distance along a second direction perpendicular to the first direction.

In some embodiments, the second bending region may be formed adjacent to the first contact region.

In some embodiments, the first lead frame may include a third bending region and a fourth bending region formed between a region on the lower surface connected to the upper surface of the first semiconductor chip and a region on the lower surface connected to the upper surface of the second semiconductor chip.

In some embodiments, the first lead frame may further include a fifth bending region formed between a region on the lower surface connected to the upper surface of the second semiconductor chip and a region on the lower surface extending outwardly.

In some embodiments, the first lead frame may be connected to a second lead frame in the region extending outwardly, and the semiconductor device may further include a second contact region including a portion of the first lead frame and a portion of the second lead frame contacting each other.

In some embodiments, the first lead frame may further include a sixth bending region on the region on the lower surface extending outwardly, such that an extension of the first lead frame along the first direction continues at a point moved by a predetermined distance along a second direction perpendicular to the first direction.

In some embodiments, the sixth bending region may be formed adjacent to the second contact region.

In some embodiments, the heat sink may be formed before the third bending region in a region connected to the upper surface of the first semiconductor chip.

In some embodiments, the heat sink may be formed between the fourth bending region and the fifth bending region.

In some embodiments, the heat sink may include: a lower metal layer connected to an upper surface of the first lead frame; and an insulating layer formed on the lower metal layer.

In some embodiments, the heat sink may further include: an upper metal layer formed on the insulating layer.

DETAILED DESCRIPTION

Figure 1:
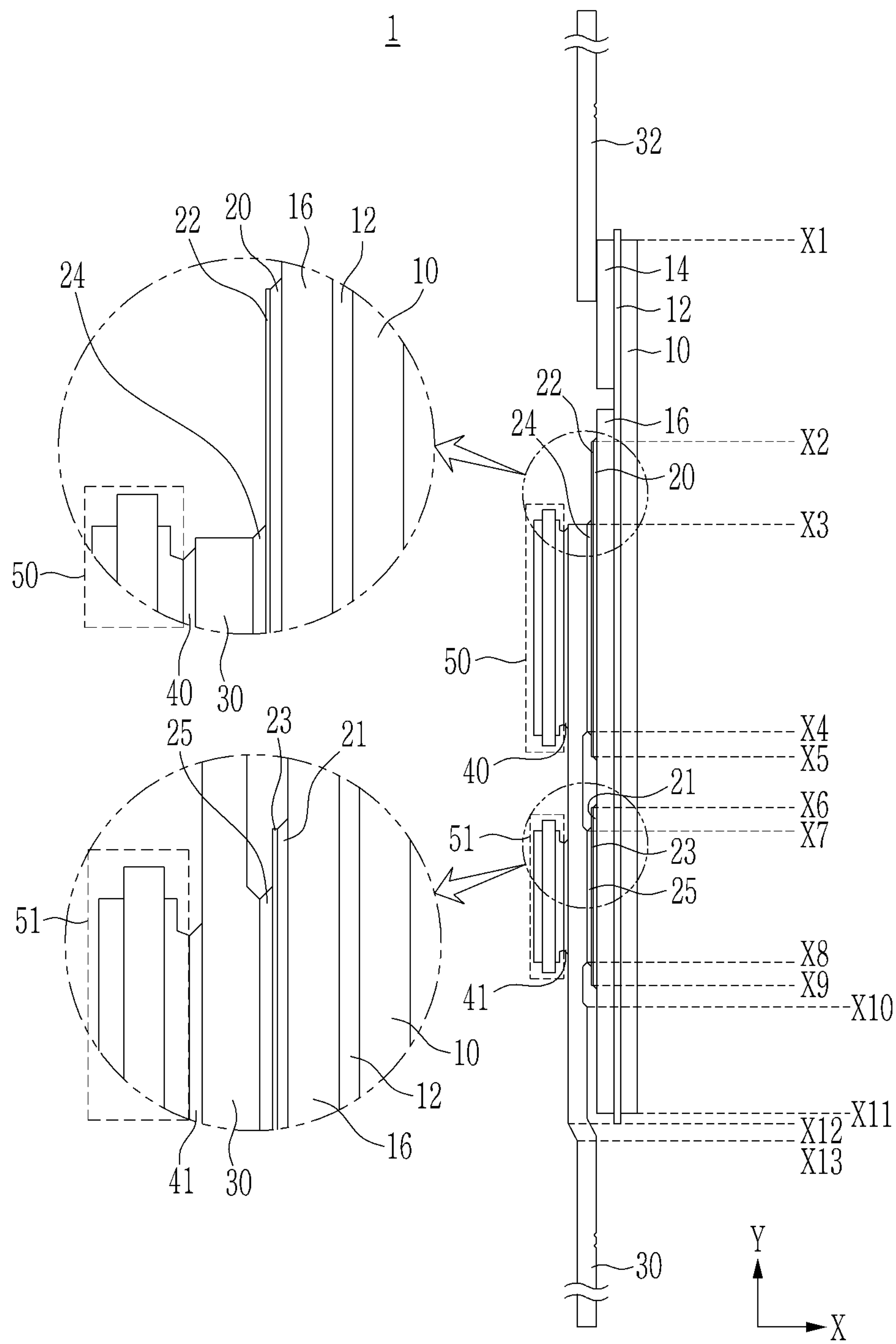
FIG. 1 and FIG. 2 are diagrams for illustrating a semiconductor device according to an example embodiment.

Hereinafter, with reference to the accompanying drawings, embodiments of the present invention will be described in detail so that those skilled in the art can easily implement the present invention. However, the present invention may be implemented in many different forms and is not limited to the embodiments described herein. In the drawings, parts irrelevant to the description are omitted in order to clearly describe the present invention, and similar reference numerals are attached to similar parts throughout the specification.

Throughout the specification and claims, when a part is said to "include" or "comprise" a certain component, it means that it may further include other components without excluding other components unless otherwise stated.

The term "lead frame" used in this specification is used to include all metal connectors without limitation regardless of their detailed form. For example, in some embodiments, a lead frame may mean a clip which is a type of metal connector.

Figure 2:
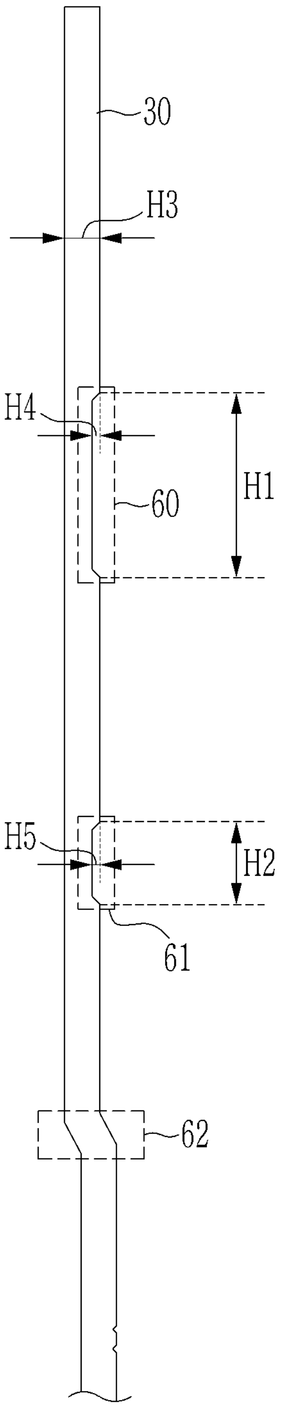

FIG. 1 and FIG. 2 are diagrams for illustrating a semiconductor device according to an example embodiment.

Referring to FIG. 1, a semiconductor device 1 according to an example embodiment may include a substrate 10, 12, 14, and 16, semiconductor chips 22 and 23, lead frames 30 and 32, and heat sinks 50 and 51.

The substrate 10, 12, 14, and 16 may include various types of substrates used in power semiconductor devices. For example, the substrate 10, 12, 14, and 16 may include a Direct Bond Copper (DBC) substrate, an Active Metal Brazing (AMB) substrate, an Insulated Metal Substrate (IMS), a Metalizing Ceramic (Metalizing Ceramic) substrate, and the like. The DBC substrate is a substrate manufactured by directly bonding a copper layer having high thermal conductivity to a ceramic base such as alumina or aluminum nitride at a high temperature, and can provide high reliability, high thermal conductivity, and high electrical performance. AMB is a method of bonding metal to a ceramic base using brazing products, can use brazing alloys to match the thermal expansion coefficient, and can provide high reliability and excellent heat transfer. IMS is a substrate formed with a structure in which an insulator layer with high thermal conductivity is sandwiched between a metal base and a copper polymer layer, and the insulator layer can effectively dissipate heat while electrically separating the copper and the metal base. Metalizing the ceramic base may mean a process of depositing a metal such as copper or silver on the ceramic base, and such a method provides high thermal conductivity and excellent electrical performance, and can withstand high operating temperatures.

To be formed into a substrate of the type described above, the substrate 10, 12, 14, and 16 may have a structure including a lower metal layer 10, an insulating layer 12 formed on the lower metal layer 10, and upper metal layers 14 and 16 formed on the insulating layer 12. For example, when the substrate 10, 12, 14, and 16 are implemented as a DBC substrate, the lower metal layer 10 and the upper metal layers 14 and 16 may include copper, and the insulating layer 12 may be formed of a ceramic layer. In this embodiment, on the basis of the lower metal layer 10, the substrate 10, 12, 14, and 16 may have a length in the first direction Y from X1 to X11.

The semiconductor chips 22 and 23 may be formed on the substrate 10, 12 and 16. The semiconductor chips 22 and 23 may be power semiconductor chips (power semiconductor devices), and may include various types of power devices including, for example, insulated gate bipolar transistors (IGBTs) and silicon carbide (SiC) devices. Bonding layers 20 and 21 may be formed between the semiconductor chips 22 and 23 and the substrate 10, 12 and 16. The bonding layers 20 and 21 may include conductive adhesives such as epoxy, solder, and sintering for fixing and bonding the semiconductor chips 22 and 23 to the substrate 10, 12 and 16, but the scope of the present invention is not limited thereto.

A plurality of semiconductor chips 22 and 23 may be formed on the substrate 10, 12 and 16. Specifically, the first semiconductor chip 22 and the second semiconductor chip 23 may be formed on the substrates 10, 12, and 16, where a length of the first semiconductor chip 22 in the first direction Y may be from X2 to X5, and a length of the second semiconductor chip 23 in the first direction Y may be from X6 to X9.

The lead frame 30 may have a lower surface connected to upper surfaces of each of the first semiconductor chip 22 and the second semiconductor chip 23, and the lead frame 30 may be formed to extend outwardly beyond the substrate 10, 12, and 16 along the first direction Y. Bonding layers 24 and 25 may be formed between the lead frame 30, and the first semiconductor chip 22 and the second semiconductor chip 23. The bonding layers 24 and 25 may include conductive adhesives such as epoxy, solder, and sintering for fixing and bonding the lead frame 30 to the first semiconductor chip 22 and the second semiconductor chip 23, respectively, but the scope of the present invention is not limited thereto. Meanwhile, the lead frame 32 may be connected to the upper surface of the substrate 10, 12, and 16, and extend outwardly in a direction opposite to the lead frame 30 along the first direction Y. In some embodiments, the lead frames 30 and 32 may include various electrically conductive materials, including copper, aluminum, alloys thereof, and the like.

In some embodiments, a length of the first direction Y in which the lead frame 30 and the first semiconductor chip 22 contact may be from X3 to X4, which may be shorter than a length of X2 to X5 of the first semiconductor chip 22 in the first direction Y. Meanwhile, a length of the first direction Y in which the lead frame 30 and the second semiconductor chip 23 contact each other may be from X7 to X8, which may be shorter than a length of X6 to X9 of the second semiconductor chip 23 in the first direction Y. Here, the second semiconductor chip 23 may be formed on the substrate 10, 12, and 16 with a predetermined distance X5 to X6 from the first semiconductor chip 22 along the first direction Y, and the predetermined distance may be formed shorter than a distance between X4 where the contact between the lead frame 30 and the first semiconductor chip 22 begins, and X7 where the contact between the lead frame 30 and the second semiconductor chip 23 begins.

The heat sinks 50 and 51 may be formed at positions corresponding to the plurality of semiconductor chips 22 and 23 on the lead frame 30. Bonding layers 40 and 41 may be formed between the heat sinks 50 and 51 and the lead frame 30. The bonding layers 40 and 41 may include conductive adhesives such as epoxy, solder, and sintering for fixing and bonding the heat sinks 50 and 51 to the lead frame, but the scope of the present invention is not limited thereto. The heat sinks 50 and 51 may form electrical insulation but may have excellent heat dissipation capability.

Referring to FIG. 2 together, the lead frame 30 may include groove regions 60 and 61.

In the lead frame 30, the groove region 60 may be formed between a region on the lower surface connected to the upper surface of the first semiconductor chip 22 and a region on the lower surface connected to the upper surface of the second semiconductor chip 23. That is, the groove region 60 may be defined in a region in which no contact is formed between the lead frame 30 and the semiconductor chips 22 and 23. Specifically, in FIG. 1, the groove region 60 may have a width H1 corresponding to a distance between X4 where the contact between the lead frame 30 and the first semiconductor chip 22 begins, and X7 where the contact between the lead frame 30 and the second semiconductor chip 23 begins. Meanwhile, a groove depth H4 of the groove region 60 may be formed within 80% of a thickness H3 of the lead frame 30. Specifically, the groove depth H4 of the groove region 60 may be formed to be a length ranging from a minimum of 0.05 mm to a maximum of 80% of the thickness H3 of the lead frame 30.

In the lead frame 30, the groove region 61 may be formed between a region on the lower surface connected to the upper surface of the second semiconductor chip 23 and a region on the lower surface extending outwardly (i.e., a region on the lower surface to the outside of the semiconductor device). That is, the groove region 61 may be defined in a region in which no contact is formed between the lead frame 30 and the semiconductor chips 22 and 23. Specifically, one end of the groove region 61 may correspond to X8 where the contact between the lead frame 30 and the second semiconductor chip 23 starts in FIG. 1, and may have a width H2. Here, the width of the groove region 61 may be smaller than the width of the groove region 60. Meanwhile, a groove depth H5 of the groove region 61 may be formed within 80% of the thickness H3 of the lead frame 30. Specifically, the groove depth H5 of the groove region 61 may be formed to be a length ranging from a minimum of 0.05 mm to a maximum of 80% of the thickness H3 of the lead frame 30. In some embodiments, the groove depth H5 of the groove region 61 may be formed to the same depth as the groove depth H4 of the groove region 60.

In some embodiments, the lead frame 30 may further include a bending region 62. The bending region 62 may allow, in the lead frame 30, on a region on the lower surface extending to the outside of the semiconductor device, the extension of the lead frame 30 along the first direction Y continues at a point moved by a predetermined distance along a second direction X perpendicular to the first direction Y. In the case of FIG. 2, it can be seen that the extension of the lead frame 30 along the first direction Y continues at a point moved by a predetermined distance to the right along the second direction X.

According to the example embodiment described with reference to FIG. 1 and FIG. 2, the lead frame 30 having excellent thermal conductivity is formed on the semiconductor chips 22 and 23, the heat sinks 50 and 51 are formed on the lead frame 30 at positions corresponding to the semiconductor chips 22 and 23, and the heat sinks 50 and 51 are exposed to the outside of the package of the semiconductor device, thereby increasing the heat dissipation effect on both sides of the upper and lower surfaces of the package and improving thermal resistance characteristics. In addition, depending on the structure of the lead frame 30, electrical resistance may be reduced compared to conventional double-sided cooling packages using spacers. On the other hand, since the lead frame 30 includes the groove regions 60 and 61, it is advantageous in that the epoxy molding compound flows smoothly and electrical insulation between the ring termination on the upper surface of the semiconductor and the lead frame can be maintained. In addition, as the lead frame 30 includes the bending region 62, there is an advantage in that the lead frame connected to the semiconductor chip does not bend, thereby providing flexibility in heat sink size.

Figure 3:
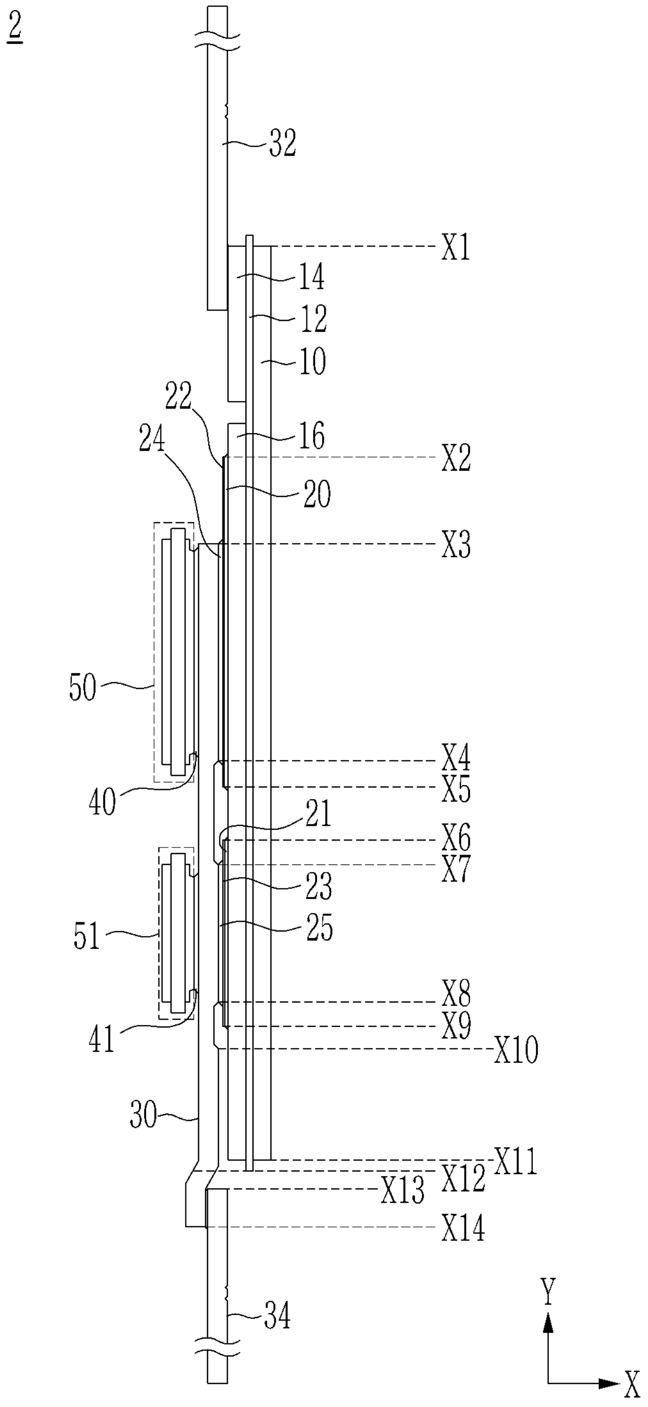
FIG. 3 and FIG. 4 are diagrams for illustrating a semiconductor device according to an example embodiment.
Figure 4:
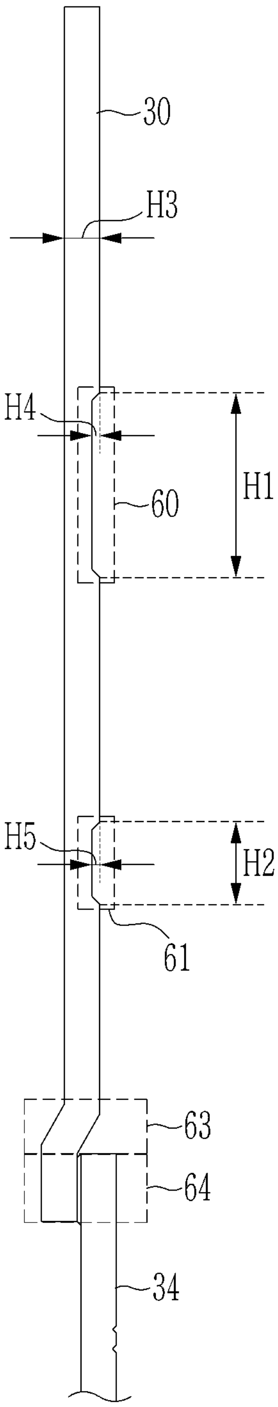

FIG. 3 and FIG. 4 are diagrams for illustrating a semiconductor device according to an example embodiment.

Referring to FIG. 3 and FIG. 4 together, the semiconductor device 2 according to an example embodiment may include a substrate 10, 12, 14, and 16, semiconductor chips 22 and 23, lead frames 30, 32, and 34, and heat sinks 50 and 51. Here, contents overlapping with the above description with respect to FIG. 1 and FIG. 2 may be omitted, and the differences will be mainly described. For example, in the semiconductor device 2, for those not inconsistent with the description below of the substrate 10, 12, 14, and 16, the semiconductor chips 22 and 23, the lead frames 30 and 32, and the heat sinks 50 and 51, reference may be made to the descriptions described above with respect to FIG. 1 and FIG. 2.

The lead frame 30 may have a lower surface connected to upper surfaces of each of the first semiconductor chip 22 and the second semiconductor chip 23, and the lead frame 30 may be formed to extend outwardly beyond the substrate 10, 12, and 16 along the first direction Y. Bonding layers 24 and 25 may be formed between the lead frame 30, and the first semiconductor chip 22 and the second semiconductor chip 23. The bonding layers 24 and 25 may include conductive adhesives such as epoxy, solder, and sintering for fixing and bonding the lead frame 30 to the first semiconductor chip 22 and the second semiconductor chip 23, respectively, but the scope of the present invention is not limited thereto. Meanwhile, the lead frame 32 may be connected to the upper surface of the substrate 10, 12, and 16, and extend outwardly in a direction opposite to the lead frame 30 along the first direction Y. In some embodiments, the lead frames 30 and 32 may include various electrically conductive materials, including copper, aluminum, alloys thereof, and the like.

In some embodiments, a length of the first direction Y in which the lead frame 30 and the first semiconductor chip 22 contact may be from X3 to X4, which may be shorter than a length of X2 to X5 of the first semiconductor chip 22 in the first direction Y. Meanwhile, a length of the first direction Y in which the lead frame 30 and the second semiconductor chip 23 contact each other may be from X7 to X8, which may be shorter than a length of X6 to X9 of the second semiconductor chip 23 in the first direction Y. Here, the second semiconductor chip 23 may be formed on the substrate 10, 12, and 16 with a predetermined distance X5 to X6 from the first semiconductor chip 22 along the first direction Y, and the predetermined distance may be formed shorter than a distance between X4 where the contact between the lead frame 30 and the first semiconductor chip 22 begins, and X7 where the contact between the lead frame 30 and the second semiconductor chip 23 begins.

The lead frame 30 may be connected to the lead frame 34 in a region extending outwardly. Here, the lead frame 30 and the lead frame 34 may form connections to each other from X13 to X14, and the lead frame 30 may be bent from X12 to X13. Specifically, the lead frame 30 may further include a bending region 63, and the semiconductor device may further include a contact region 64. Here, the contact region 64 may include a portion of the lead frame 30 and a portion of the lead frame 34 that are in contact with each other, and the bending region 63 may allow, in the lead frame 30, on a region extending to the outside of the semiconductor device, the extension of the lead frame 30 along the first direction Y continues at a point moved by a predetermined distance along a second direction X perpendicular to the first direction Y. In the case of FIG. 4, it can be seen that the extension of the lead frame 30 along the first direction Y continues at a point moved by a predetermined distance to the left along the second direction X. At this time, the bending region 63 may be formed to be adjacent to the contact region 64.

According to the example embodiment described with reference to FIG. 3 and FIG. 4, the lead frame 30 having excellent thermal conductivity is formed on the semiconductor chips 22 and 23, the heat sinks 50 and 51 are formed on the lead frame 30 at positions corresponding to the semiconductor chips 22 and 23, and the heat sinks 50 and 51 are exposed to the outside of the package of the semiconductor device, thereby increasing the heat dissipation effect on both sides of the upper and lower surfaces of the package and improving thermal resistance characteristics. In addition, depending on the structure of the lead frame 30, electrical resistance may be reduced compared to conventional double-sided cooling packages using spacers. On the other hand, since the lead frame 30 includes the groove regions 60 and 61, it is advantageous in that the epoxy molding compound flows smoothly and electrical insulation between the ring termination on the upper surface of the semiconductor and the lead frame can be maintained. In addition, as the lead frame 30 includes the bending region 62 and is connected to the lead frame 34 through the contact region 64, there is an advantage in that the lead frame connected to the semiconductor chip does not bend, thereby providing flexibility in heat sink size. In some embodiments, the lead frame 30 may be formed as a clip.

Figure 5:
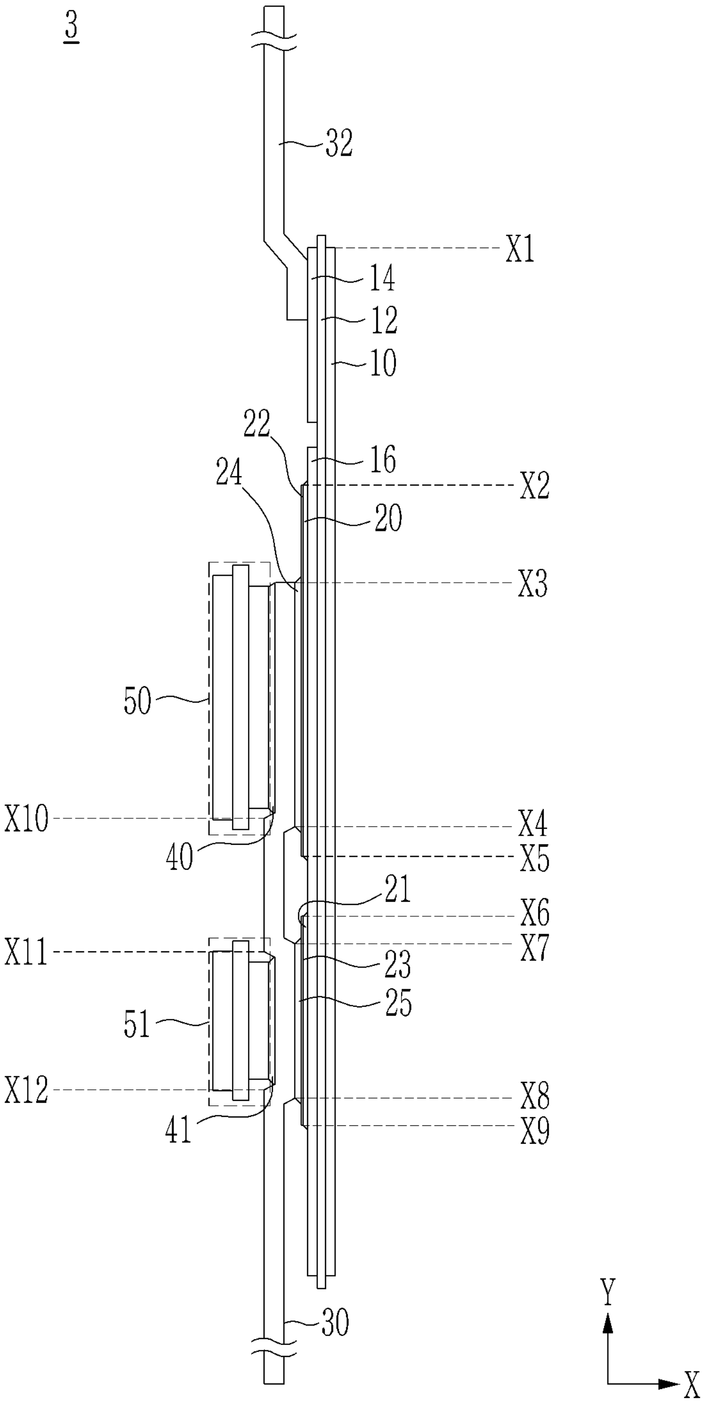
FIG. 5 and FIG. 6 are diagrams for illustrating a semiconductor device according to an example embodiment.
Figure 6:
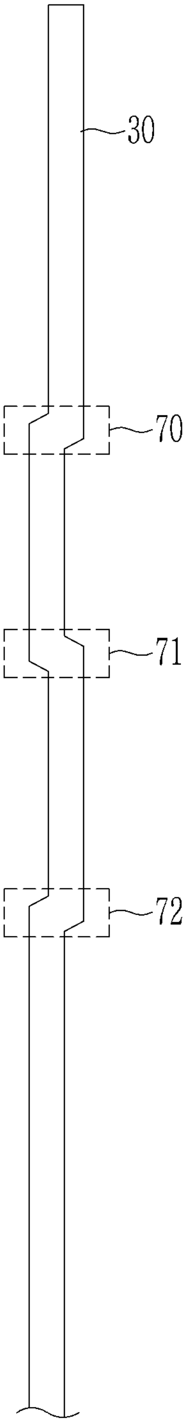

FIG. 5 and FIG. 6 are diagrams for illustrating a semiconductor device according to an example embodiment.

Referring to FIG. 5 and FIG. 6 together, the semiconductor device 3 according to an example embodiment may include a substrate 10, 12, 14, and 16, semiconductor chips 22 and 23, lead frames 30, 32, and 34, and heat sinks 50 and 51. Here, contents overlapping with the above description with respect to FIG. 1 to FIG. 4 may be omitted, and the differences will be mainly described. For example, in the semiconductor device 3, for those not inconsistent with the description below of the substrate 10, 12, 14, and 16, the semiconductor chips 22 and 23, the lead frames 30 and 32, and the heat sinks 50 and 51, reference may be made to the descriptions described above with respect to FIG. 1 to FIG. 4.

The lead frame 30 may have a lower surface connected to upper surfaces of each of the first semiconductor chip 22 and the second semiconductor chip 23, and the lead frame 30 may be formed to extend outwardly beyond the substrate 10, 12, and 16 along the first direction Y. Bonding layers 24 and 25 may be formed between the lead frame 30, and the first semiconductor chip 22 and the second semiconductor chip 23. The bonding layers 24 and 25 may include conductive adhesives such as epoxy, solder, and sintering for fixing and bonding the lead frame 30 to the first semiconductor chip 22 and the second semiconductor chip 23, respectively, but the scope of the present invention is not limited thereto. Meanwhile, the lead frame 32 may be connected to the upper surface of the substrate 10, 12, and 16, and extend outwardly in a direction opposite to the lead frame 30 along the first direction Y. In some embodiments, the lead frames 30 and 32 may include various electrically conductive materials, including copper, aluminum, alloys thereof, and the like.

In some embodiments, a length of the first direction Y in which the lead frame 30 and the first semiconductor chip 22 contact may be from X3 to X4, which may be shorter than a length of X2 to X5 of the first semiconductor chip 22 in the first direction Y. Meanwhile, a length of the first direction Y in which the lead frame 30 and the second semiconductor chip 23 contact each other may be from X7 to X8, which may be shorter than a length of X6 to X9 of the second semiconductor chip 23 in the first direction Y. Here, the second semiconductor chip 23 may be formed on the substrate 10, 12, and 16 with a predetermined distance X5 to X6 from the first semiconductor chip 22 along the first direction Y, and the predetermined distance may be formed shorter than a distance between X4 where the contact between the lead frame 30 and the first semiconductor chip 22 begins, and X7 where the contact between the lead frame 30 and the second semiconductor chip 23 begins.

The lead frame 30 has a bending region 70 and a bending region 71 formed between a region on the lower surface connected to the upper surface of the first semiconductor chip 22 and a region on the lower surface connected to the upper surface of the second semiconductor chip 23. Meanwhile, the lead frame 30 may further include a bending region 72 formed between a region on the lower surface connected to the upper surface of the second semiconductor chip 23 and a region extending to the outside of the semiconductor device. The bending region 70 and the bending region 71 may be formed to be spaced apart by a distance between X10 and X11 shown in FIG. 5, and the bending region 71 and the bending region 72 may be formed to be spaced apart by a distance between X11 and X12.

The heat sink 50 may be formed before the bending region 70 in a region connected to the upper surface of the first semiconductor chip 22, and the heat sink 51 may be formed between the bending region 71 and the bending region 72.

According to the example embodiment described with reference to FIG. 5 and FIG. 6, the lead frame 30 having excellent thermal conductivity is formed on the semiconductor chips 22 and 23, and the heat sinks 50 and 51 are formed on the lead frame 30 at positions corresponding to the semiconductor chips 22 and 23 minimizing a distance from the semiconductor chips 22 and 23, so that heat generated from the semiconductor chips 22 and 23 can be quickly accommodated. In addition, the heat sinks 50 and 51 are exposed to the outside of the package of the semiconductor device, thereby increasing the heat dissipation effect on both sides of the upper and lower surfaces of the package and improving thermal resistance characteristics. In addition, depending on the structure of the lead frame 30, electrical resistance may be reduced compared to conventional double-sided cooling packages using spacers.

Figure 7:
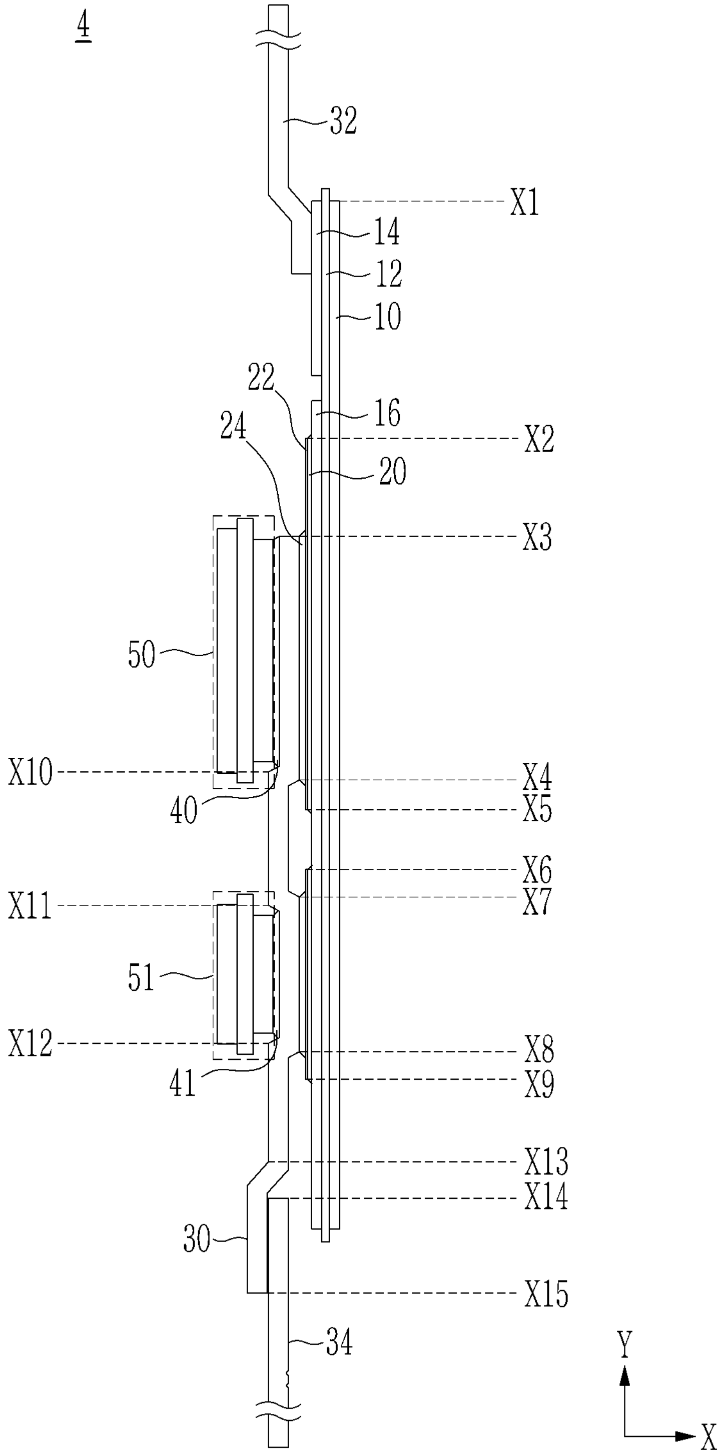
FIG. 7 and FIG. 8 are diagrams for illustrating a semiconductor device according to an example embodiment.
Figure 8:
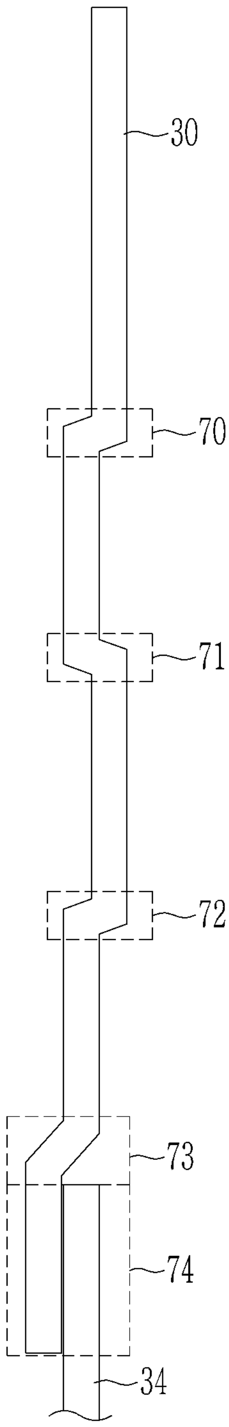

FIG. 7 and FIG. 8 are diagrams for illustrating a semiconductor device according to an example embodiment.

Referring to FIG. 7 and FIG. 8 together, the semiconductor device 4 according to an example embodiment may include a substrate 10, 12, 14, and 16, semiconductor chips 22 and 23, lead frames 30, 32, and 34, and heat sinks 50 and 51. Here, contents overlapping with the above description with respect to FIG. 1 to FIG. 6 may be omitted, and the differences will be mainly described. For example, in the semiconductor device 3, for those not inconsistent with the description below of the substrate 10, 12, 14, and 16, the semiconductor chips 22 and 23, the lead frames 30, 32, and 34, and the heat sinks 50 and 51, reference may be made to the descriptions described above with respect to FIG. 1 to FIG. 6.

The lead frame 30 may have a lower surface connected to upper surfaces of each of the first semiconductor chip 22 and the second semiconductor chip 23, and the lead frame 30 may be formed to extend outwardly beyond the substrate 10, 12, and 16 along the first direction Y. Bonding layers 24 and 25 may be formed between the lead frame 30, and the first semiconductor chip 22 and the second semiconductor chip 23. The bonding layers 24 and 25 may include conductive adhesives such as epoxy, solder, and sintering for fixing and bonding the lead frame 30 to the first semiconductor chip 22 and the second semiconductor chip 23, respectively, but the scope of the present invention is not limited thereto. Meanwhile, the lead frame 32 may be connected to the upper surface of the substrate 10, 12, and 16, and extend outwardly in a direction opposite to the lead frame 30 along the first direction Y. In some embodiments, the lead frames 30 and 32 may include various electrically conductive materials, including copper, aluminum, alloys thereof, and the like.

In some embodiments, a length of the first direction Y in which the lead frame 30 and the first semiconductor chip 22 contact may be from X3 to X4, which may be shorter than a length of X2 to X5 of the first semiconductor chip 22 in the first direction Y. Meanwhile, a length of the first direction Y in which the lead frame 30 and the second semiconductor chip 23 contact each other may be from X7 to X8, which may be shorter than a length of X6 to X9 of the second semiconductor chip 23 in the first direction Y. Here, the second semiconductor chip 23 may be formed on the substrate 10, 12, and 16 with a predetermined distance X5 to X6 from the first semiconductor chip 22 along the first direction Y, and the predetermined distance may be formed shorter than a distance between X4 where the contact between the lead frame 30 and the first semiconductor chip 22 begins, and X7 where the contact between the lead frame 30 and the second semiconductor chip 23 begins.

The lead frame 30 may be connected to the lead frame 34 in a region extending outwardly. Here, the lead frame 30 and the lead frame 34 may form connections to each other from X14 to X15, and the lead frame 30 may be bent from X13 to X14. Specifically, the lead frame 30 may further include a bending region 73, and the semiconductor device may further include a contact region 74. Here, the contact region 74 may include a portion of the lead frame 30 and a portion of the lead frame 34 that are in contact with each other, and the bending region 73 may allow, in the lead frame 30, on a region extending to the outside of the semiconductor device, the extension of the lead frame 30 along the first direction Y continues at a point moved by a predetermined distance along a second direction X perpendicular to the first direction Y. In the case of FIG. 8, it can be seen that the extension of the lead frame 30 along the first direction Y continues at a point moved by a predetermined distance to the left along the second direction X. At this time, the bending region 73 may be formed to be adjacent to the contact region 74.

The lead frame 30 has a bending region 70 and a bending region 71 formed between a region on the lower surface connected to the upper surface of the first semiconductor chip 22 and a region on the lower surface connected to the upper surface of the second semiconductor chip 23. Meanwhile, the lead frame 30 may further include a bending region 72 formed between a region on the lower surface connected to the upper surface of the second semiconductor chip 23 and a region extending to the outside of the semiconductor device. The bending region 70 and the bending region 71 may be formed to be spaced apart by a distance between X10 and X11 shown in FIG. 5, and the bending region 71 and the bending region 72 may be formed to be spaced apart by a distance between X11 and X12.

The heat sink 50 may be formed before the bending region 70 in a region connected to the upper surface of the first semiconductor chip 22, and the heat sink 51 may be formed between the bending region 71 and the bending region 72.

According to the example embodiment described with reference to FIG. 7 and FIG. 8, the lead frame 30 having excellent thermal conductivity is formed on the semiconductor chips 22 and 23, and the heat sinks 50 and 51 are formed on the lead frame 30 at positions corresponding to the semiconductor chips 22 and 23 minimizing a distance from the semiconductor chips 22 and 23, so that heat generated from the semiconductor chips 22 and 23 can be quickly accommodated. In addition, the heat sinks 50 and 51 are exposed to the outside of the package of the semiconductor device, thereby increasing the heat dissipation effect on both sides of the upper and lower surfaces of the package and improving thermal resistance characteristics. In addition, depending on the structure of the lead frame 30, electrical resistance may be reduced compared to conventional double-sided cooling packages using spacers. In some embodiments, the lead frame 30 may be formed as a clip.

Figure 9:
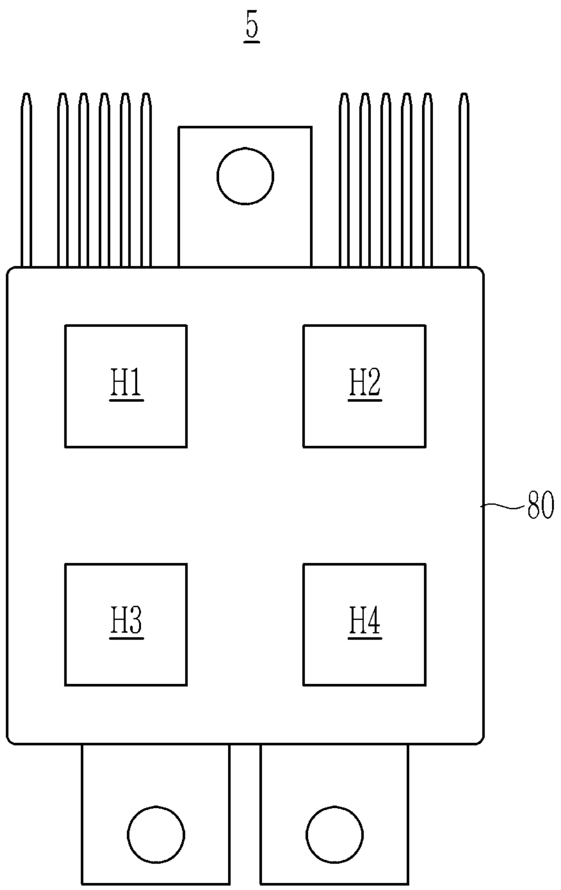
FIG. 9 to FIG. 11 are diagrams for illustrating a semiconductor device according to some embodiments.
Figure 10:
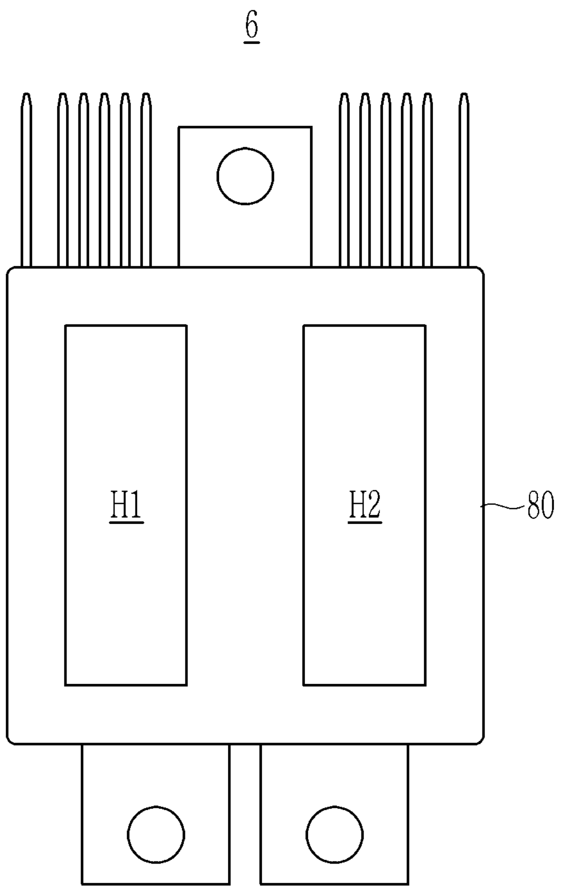
Figure 11:
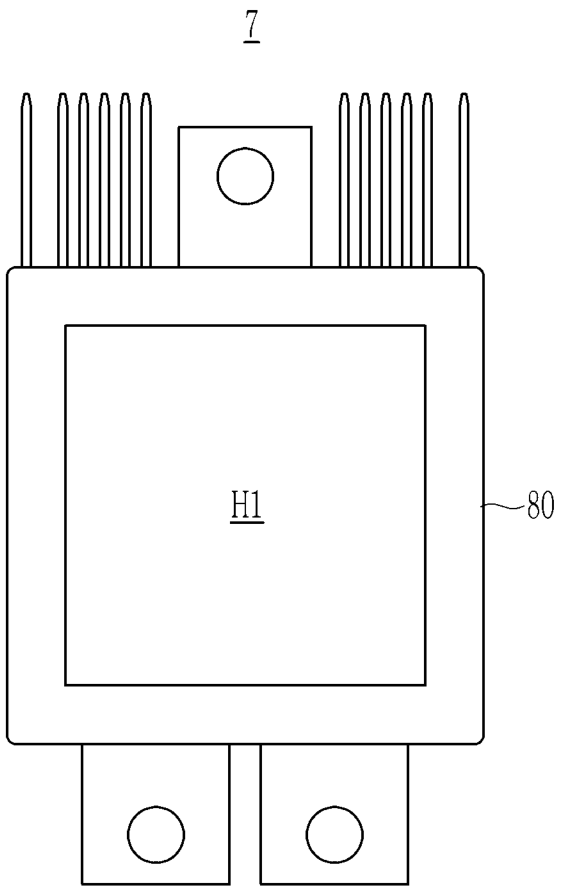

FIG. 9 to FIG. 11 are diagrams for illustrating a semiconductor device according to some embodiments.

Referring to FIG. 9, a molding part 80 may fix and protect semiconductor chips and other components mounted inside a semiconductor device (e.g., a power package 5). The molding part 80 may be formed of an encapsulant such as an epoxy molding compound (EMC), and EMC can be made of a composite material using various raw materials such as silica, epoxy resin, phenol resin, carbon black, and flame retardant. Of course, the material of the molding part 80 is not limited to EMC, and various arbitrary materials may be used.

In this embodiment, when four semiconductor chips are arranged in a 2×2 array, the heat sinks H1 to H4 may be formed at positions corresponding to each of the four semiconductor chips. In addition, the heat sinks H1 to H4 are exposed to the outside of the molding part 80 of the semiconductor device 5, thereby increasing the heat dissipation effect on both sides of the upper and lower surfaces of the package and improving thermal resistance characteristics.

Referring to FIG. 10, a heat sink H1 may be formed at a position corresponding to two semiconductor chips disposed in a left column among semiconductor chips disposed in a 2×2 arrangement, and a heat sink H2 may be formed at a position corresponding to two semiconductor chips disposed in a right column among semiconductor chips disposed in a 2×2 arrangement. In addition, the heat sinks H1 to H4 are exposed to the outside of the molding part 80 of the semiconductor device 6, thereby increasing the heat dissipation effect on both sides of the upper and lower surfaces of the package and improving thermal resistance characteristics.

Referring to FIG. 11, the heat sink H1 may be formed at a position corresponding to all four semiconductor chips arranged in a 2×2 array. In addition, the heat sinks H1 to H4 are exposed to the outside of the molding part 80 of the semiconductor device 7, thereby increasing the heat dissipation effect on both sides of the upper and lower surfaces of the package and improving thermal resistance characteristics.

Figure 12:
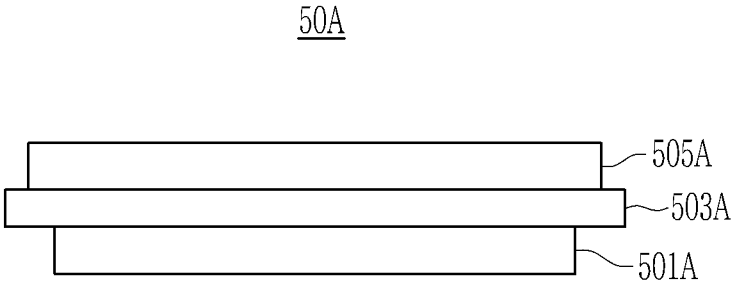
FIG. 12 to FIG. 14 are diagrams for illustrating heat sinks according to some embodiments.
Figure 13:
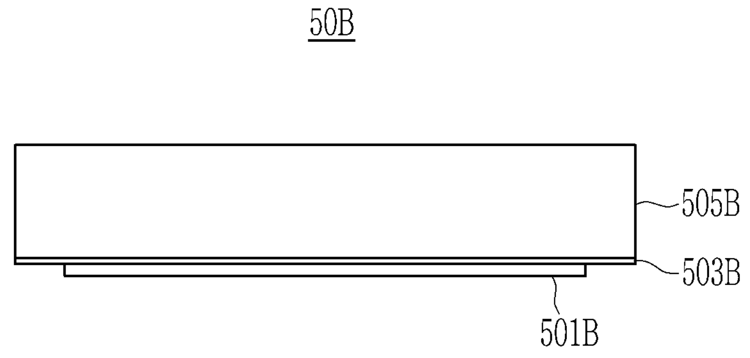
Figure 14:
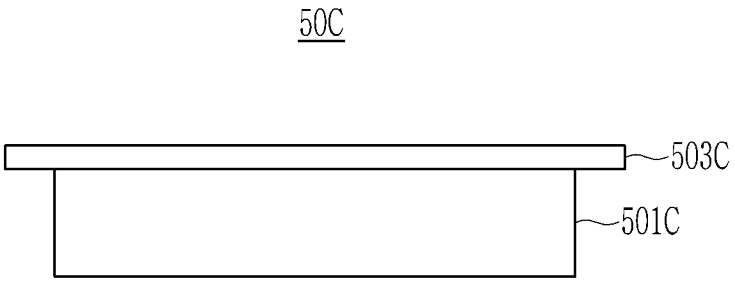

FIG. 12 to FIG. 14 are diagrams for illustrating heat sinks according to some embodiments.

Referring to FIG. 12, the heat sink 50A may include a lower metal layer 501A, an insulating layer 503A formed on the lower metal layer 501A, and an upper metal layer 505A formed on the insulating layer 503A. Here, the thickness of the lower metal layer 501A and the upper metal layer 505A may be the same, and the thickness of the insulating layer 503A may be smaller than the thickness of the lower metal layer 501A and the upper metal layer 505A. Also, the widths of the lower metal layer 501A and the upper metal layer 505A may be smaller than the width of the insulating layer 503A. The heat sink 50A has the advantage of being flexible in the thickness of the upper and lower metal layers and the thermal conductivity of the insulating layer, so that it can be freely changed according to the required characteristics and price.

Referring to FIG. 13, the heat sink 50B may include a lower metal layer 501B, an insulating layer 503B formed on the lower metal layer 510B, and an upper metal layer 505B formed on the insulating layer 503B. Here, the thickness of the upper metal layer 505A may be the thickest, the thickness of the lower metal layer 501B may be next, and the thickness of the insulating layer 503B may be the thinnest. The upper metal layer 505A and the insulating layer 503B may have the same width, and the lower metal layer 510B may have a smaller width than the upper metal layer 505A and the insulating layer 503B. The heat sink 50B has an advantage of reducing the destruction of the insulating layer due to external impact by having a thick upper metal layer.

Referring to FIG. 14, the heat sink 50C may include a lower metal layer 501C and an insulating layer 503C formed on the lower metal layer 510C. Here, the lower metal layer 501C may be formed to be thicker than the insulating layer 503C, and the width of the lower metal layer 501C may be smaller than that of the insulating layer 503C. The heat sink 50C has an advantage of facilitating heat transfer generated in the semiconductor chip by maximizing the thickness of the lower metal layer.

According to example embodiments, a semiconductor device capable of increasing a heat dissipation effect, improving thermal resistance characteristics, and reducing electrical resistance may be provided. In addition, it is possible to provide a semiconductor device capable of simplifying a manufacturing process, increasing process productivity, improving yield, and reducing manufacturing cost.

Although the embodiments of the present invention have been described in detail above, the scope of the present invention is not limited thereto, and using the basic concept of the present invention defined in the following claims, various modifications and improvements of those skilled in the art to which the present invention belongs also fall within the scope of the present invention.

What is claimed is:

1. A semiconductor device, comprising:

a substrate formed to extend along a first direction;

a first semiconductor chip formed on the substrate;

a second semiconductor chip formed on the substrate at a predetermined distance from the first semiconductor chip along the first direction;

a first lead frame extending outwardly beyond the substrate along the first direction, the first lead frame having a lower surface connected to upper surfaces of each of the first semiconductor chip and the second semiconductor chip; and a heat sink formed on an upper surface of the first lead frame at a position corresponding to the first semiconductor chip and the second semiconductor chip, the heat sink comprises a first heat sink corresponding to the first semiconductor chip and a second heat sink corresponding to the second semiconductor chip, the first heat sink and the second heat sink being spaced apart from each other, wherein the first lead frame includes a first groove region formed between a region on the lower surface connected to the upper surface of the first semiconductor chip and a region on the lower surface connected to the upper surface of the second semiconductor chip, wherein the heat sink is in contact with a first side of the semiconductor device and the substrate is in contact with a second side of the semiconductor device opposite to the first side, to form a double-sided cooling structure, wherein a contact length between the first lead frame and the first semiconductor chip in the first direction is less than a length of the first semiconductor chip in the first direction, and a contact length between the first lead frame and the second semiconductor chip in the first direction is less than a length of the second semiconductor chip in the first direction, and, wherein the predetermined distance is formed shorter than a distance between a point where contact between the first lead frame and the first semiconductor chip begins and a point where contact between the first lead frame and the second semiconductor chip begins.

2. The semiconductor device of claim 1, wherein:

the first lead frame further includes a second groove region formed between a region on the lower surface connected to the upper surface of the second semiconductor chip and a region on the lower surface extending outwardly.

3. The semiconductor device of claim 2, wherein:

a width of the second groove region is smaller than a width of the first groove region.

4. The semiconductor device of claim 2, wherein:

a groove depth of the first groove region and a groove depth of the second groove region are formed within 80% of a thickness of the first lead frame.

5. The semiconductor device of claim 2, wherein:

the first lead frame further includes a first bending region on the region on the lower surface extending outwardly, such that an extension of the first lead frame along the first direction continues at a point moved by a predetermined distance along a second direction perpendicular to the first direction.

6. The semiconductor device of claim 2, wherein:

the first lead frame is connected to a second lead frame in the region extending outwardly, and the semiconductor device further includes a first contact region including a portion of the first lead frame and a portion of the second lead frame contacting each other.

7. The semiconductor device of claim 6, wherein:

the first lead frame further includes a second bending region on the region on the lower surface extending outwardly, such that an extension of the first lead frame along the first direction continues at a point moved by a predetermined distance along a second direction perpendicular to the first direction.

8. The semiconductor device of claim 7, wherein:

the second bending region is formed adjacent to the first contact region.

9. The semiconductor device of claim 1, wherein:

the heat sink includes:

a lower metal layer connected to an upper surface of the first lead frame; and an insulating layer formed on the lower metal layer.

* * * * *